United States Patent
Pazzocco et al.

(10) Patent No.: US 12,002,505 B2
(45) Date of Patent: Jun. 4, 2024

(54) MANAGING MEMORY BASED ON ACCESS DURATION

(71) Applicant: Micron Technology, Inc., Boise, ID (US)

(72) Inventors: Riccardo Pazzocco, Verona (IT); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 290 days.

(21) Appl. No.: 17/649,104

(22) Filed: Jan. 27, 2022

(65) Prior Publication Data
US 2023/0215495 A1 Jul. 6, 2023

Related U.S. Application Data

(60) Provisional application No. 63/266,218, filed on Dec. 30, 2021.

(51) Int. Cl.
*G11C 11/4096* (2006.01)
*G11C 11/4076* (2006.01)
*G11C 11/408* (2006.01)
*G11C 11/4093* (2006.01)

(52) U.S. Cl.
CPC ...... *G11C 11/4096* (2013.01); *G11C 11/4076* (2013.01); *G11C 11/4087* (2013.01); *G11C 11/4093* (2013.01)

(58) Field of Classification Search
CPC ............ G11C 11/4096; G11C 11/4076; G11C 11/4087; G11C 11/4093
USPC .................................................. 365/189.011
See application file for complete search history.

(56) References Cited

U.S. PATENT DOCUMENTS

| | | | |
|---|---|---|---|
| 10,120,584 B2 * | 11/2018 | Shirakawa | G06F 3/0659 |
| 2022/0197564 A1 * | 6/2022 | Visconti | G06F 3/0679 |
| 2024/0020016 A1 * | 1/2024 | Reina | G06F 3/0644 |

* cited by examiner

*Primary Examiner* — Connie C Yoha
(74) *Attorney, Agent, or Firm* — Holland & Hart LLP

(57) ABSTRACT

Methods, systems, and devices for managing memory based on access duration are described. A memory device may include a first set of memory cells resilient against access durations of a first duration and a second set of memory cells resilient against access durations of a shorter duration. A command for accessing the memory device may be received. The command may be associated with an access duration. Whether to access, as part of executing the command, the first set of memory cells or the second set of memory cells may be determined based on the access duration. The first set of memory cells may be accessed, as part of executing the command, based on the access duration being greater than a threshold duration. Or the second set of memory cells may be accessed based on the access duration being less than or equal to the threshold duration.

25 Claims, 6 Drawing Sheets

MANAGING MEMORY BASED ON ACCESS DURATION

CROSS REFERENCE

The present Application for Patent claims the benefit of U.S. Provisional Patent Application No. 63/266,218 by PAZZOCCO et al., entitled "MANAGING MEMORY BASED ON ACCESS DURATION," filed Dec. 30, 2021, assigned to the assignee hereof, and expressly incorporated by reference herein.

FIELD OF TECHNOLOGY

The following relates to one or more systems for memory, including managing memory based on access duration.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source. FeRAM may be able to achieve densities similar to volatile memory but may have non-volatile properties due to the use of a ferroelectric capacitor as a storage device.

DETAILED DESCRIPTION

Figure 1:
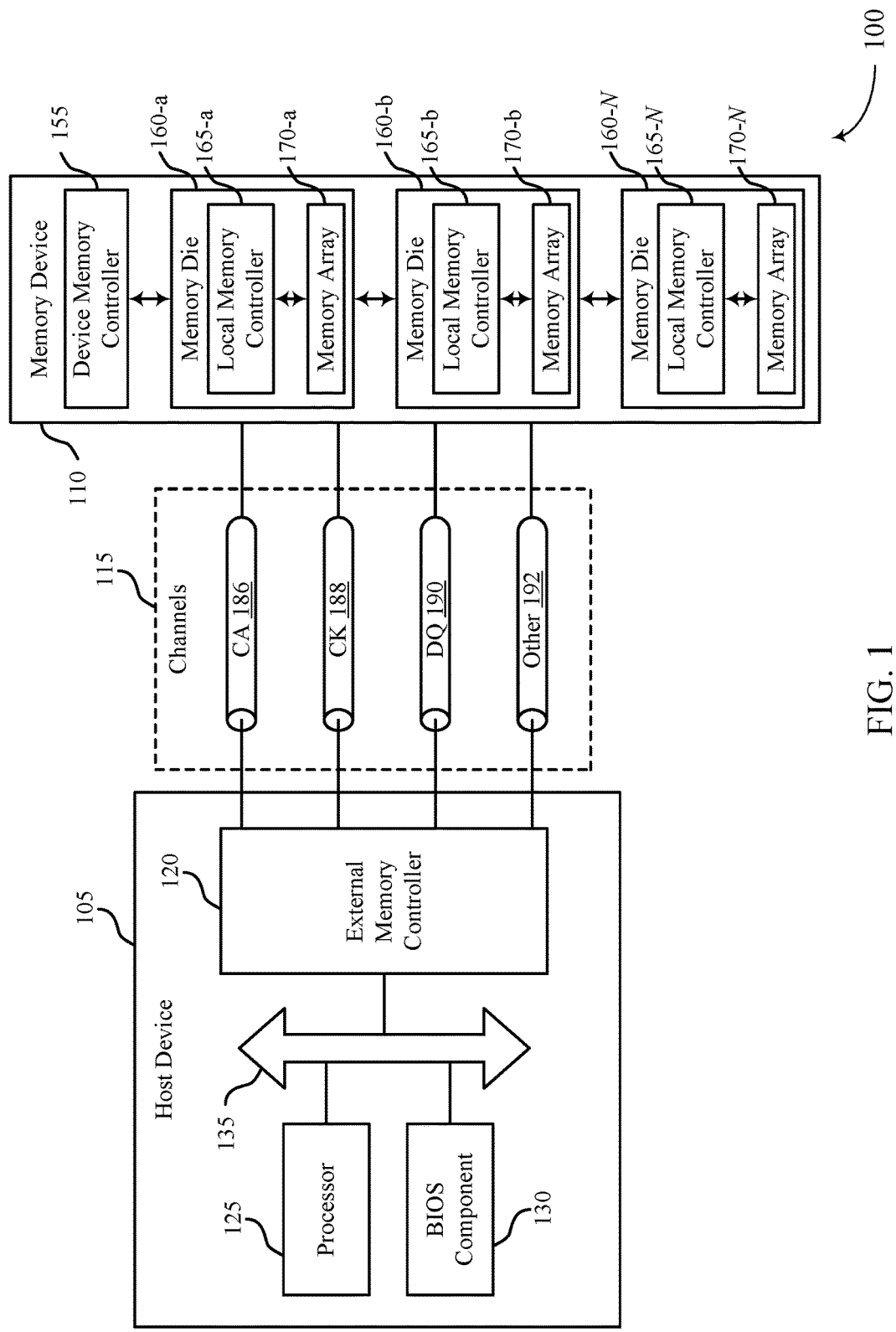
FIG. 1 illustrates an example of a system that supports managing memory based on access duration in accordance with examples as disclosed herein.

Pages of memory cells (which may be referred to as physical pages) in a memory device may be opened for an access duration, where the access duration may have a lower limit and an upper limit. Frequently accessing pages for longer access durations (durations nearer the upper limit) may decrease a performance of the memory cells—e.g., may cause a sensing window of the memory cells to decrease at an accelerated rate. Frequently accessing pages for shorter access durations (durations nearer the lower limit) may also decrease a performance of the memory cells—e.g., may cause a stress-induced leakage current of the memory cells to increase at an accelerated rate. In some examples, within a threshold quantity of cycles, one or both of the decrease in the sensing window and the increase in the stress-induced leakage current causes bit errors to occur at the memory cells at an unacceptable rate. To counteract the degradation of the sensing window caused by extended access operations, the memory cells may be configured with larger sensing windows. However, enlarging a sensing window of a memory cell may increase a susceptibility of the memory cell to negative effects caused by frequently being accessed for shorter durations (e.g., increased stress-induced leakage current), and vice versa.

Some physical pages in a memory device may be frequently opened for a shortened duration—e.g., a duration that is less than the extended duration threshold. In such cases, if the memory cells in the memory device are configured with larger sensing windows (e.g., to increase a resiliency against the effects of extended open page durations), the memory cells in those physical pages may reach an end of their operating lives at an accelerated pace relative to the other memory cells in the memory device (and relative to if the memory cells had been configured with smaller sensing windows). Accordingly, increasing a resiliency of the memory cells against the effects of extended open page durations may increase a susceptibility of the memory cells to the effects of a high quantity of shorter open page durations (which may be referred to as stress cycling). Conversely, maintaining the sensing windows of the memory cells at the lower level may increase a resiliency of the memory cells against the effects of stress cycling but also increase a susceptibility of the memory cells to the effects of extended open page durations.

To reduce an effect of stress cycling on memory cells configured to be resilient against extended open page durations and to thus extend an operating life of a memory device, a memory device may be configured with memory cells of different types—e.g., a first type that is resilient against extended open page durations and a second type that is resilient against stress cycling. Accordingly, the memory device may be configured to move data in logical pages associated with frequent stress cycling from a physical page of memory cells configured to be resilient to extended open page durations to a physical page of memory cells configured to be resilient to stress cycling. Similarly, the memory device may be configured to move data in logical pages associated with frequent extended open page durations from a physical page of memory cells configured to be resilient to stress cycling to a physical page of memory cells configured to be resilient to extended open page durations.

Features of the disclosure are initially described in the context of systems and dies. Features of the disclosure are also described in the context of a memory device and a flowchart These and other features of the disclosure are further illustrated by and described with reference to an apparatus diagram and flowcharts that relate to managing memory based on access duration.

FIG. 1 illustrates an example of a system 100 that supports managing memory based on access duration in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program or software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). In some examples, a 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic, or components) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between component of the host device 105, such as the processor 125, and the memory device 110. The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., transmission mediums, conductors) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device 110 may include a first set of memory cells resilient against access durations of a first duration and a second set of memory cells resilient against access durations of a shorter duration. The memory device 110 may receive a command for accessing the memory device—e.g., from host device 105. The command may be associated with an access duration. The memory device 110 may determine whether to access, as part of executing the command, the first set of memory cells or the second set of memory cells based on a length of the access duration. The memory device 110 may access, as part of executing the command, the first set of memory cells if the access duration is greater than a threshold duration or the second set of memory cells if the access duration being less than or equal to the threshold duration.

Figure 2:
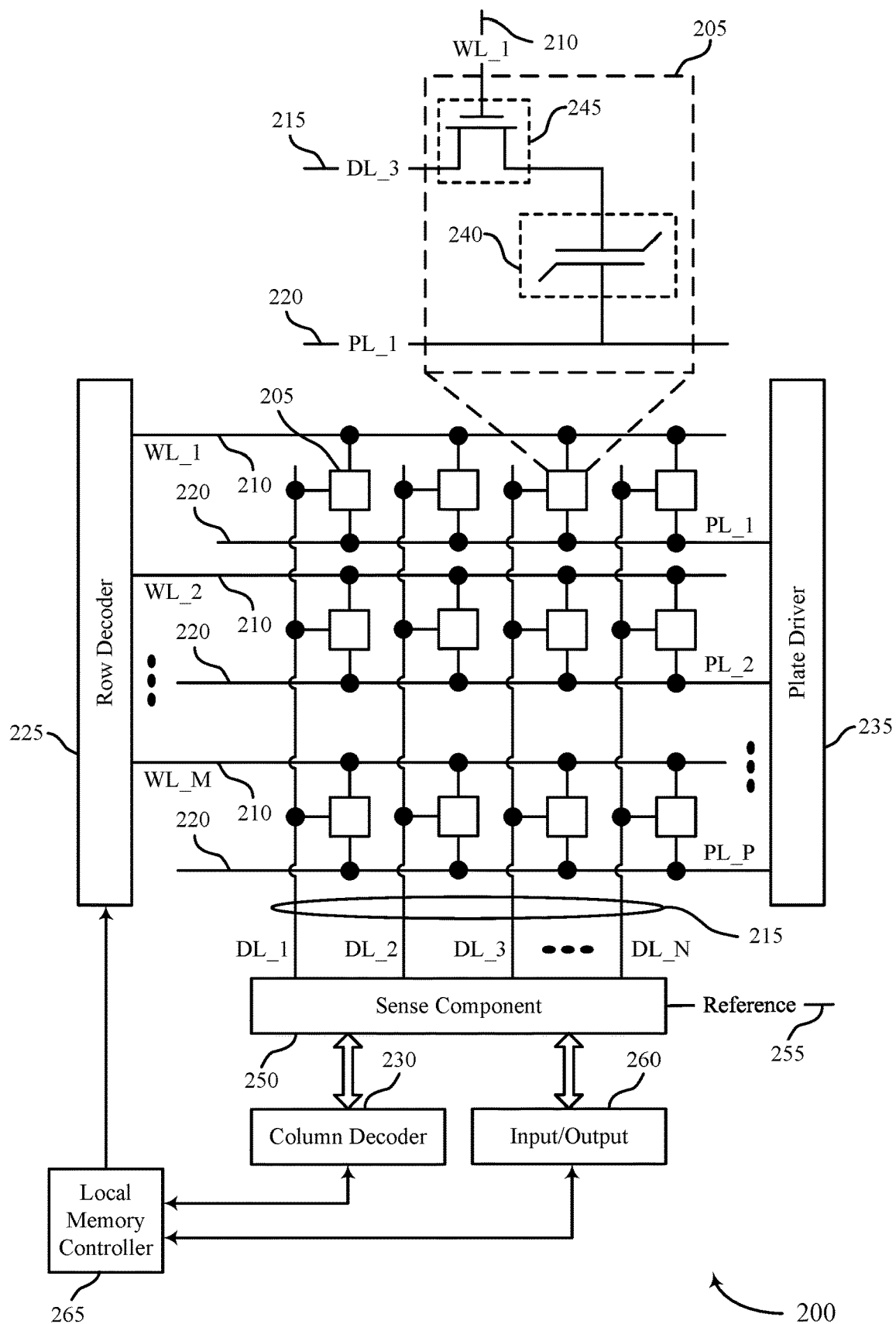
FIG. 2 illustrates an example of a memory die that supports managing memory based on access duration in accordance with examples as disclosed herein.

FIG. 2 illustrates an example of a memory die 200 that supports managing memory based on access duration in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245 (e.g., a cell selection component). The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, a plate driver 235, or a combination thereof. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., a logic state, charged state). The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may be operable to perform a read operation (e.g., a sense operation) on one or more memory cells 205 of the memory die 200. During a read operation, the state (e.g., logic state, charged state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250 (e.g., latch the sense component) and compare the signal received from the memory cell 205 to a reference (e.g., the reference 255). Based on that comparison, the sense component 250 may determine a logic state that is stored on the memory cell 205.

Different memory cells 205 in the memory die 200 may have different characteristics than other memory cells 205. In some examples, memory cells 205 in a first portion of the memory die 200 may have different characteristics than memory cells 205 in a second portion of the memory die 200. For example, if memory die 200 uses a three-dimensional architecture, the memory cells 205 in a first deck may have different characteristics than the memory cells 205 in a second deck. In other examples, memory cells 205 on one side of a deck 2D memory die may have different characteristics than the memory cells on another side of the deck or 2D memory die. The differences between the memory cells 205 may result from a process used to form the memory cells 205 during manufacturing—e.g., despite attempts to manufacture the memory cells 205 as similarly as possible. Additionally, or alternatively, the differences between the memory cells 205 may result from a positioning of the memory cells 205 relative to the other memory cells 205—e.g., memory cells 205 that are positioned above (e.g., overlies) other memory cells 205 may have different characteristics based on experiencing different thermal conditions.

To access (e.g., to read or write) data in the memory die 200, the local memory controller 265 may open a set of the memory cells 205, which may be referred to as a page of the memory cells 205 or succinctly as a physical page. In some examples, a physical page includes 1028 memory cells 205 (which may correspond to 1028 bits), and the local memory controller 265 is capable of reading 32 or 64 bits from the physical page at a time. To open a physical page, the local memory controller 265 may issue an ACT command that causes the memory cells 205 in the physical page to be connected to respective digit lines. To increase an efficiency of access operations, the local memory controller 265 may maintain a physical page in an open state so that multiple access operations may be sequentially performed for the physical page without performing operations for closing and reopening the physical page between each access operation.

In some examples, a local memory controller 265 may be configured to keep a physical page open for at least a threshold duration (which may be referred to as a minimum threshold duration). And the local memory controller 265 may be configured to keep a physical page open for no longer than a second threshold duration (which may be referred to as a maximum threshold). In some examples, the minimum duration may be referred to as a minimum row active time (which may be represented as tRAS_min) and the maximum duration may be referred to as a maximum row active time (which may be represented as tRAS_max). Maintaining a physical page in an open state for an extended duration may improve an efficiency of a set of operations relative to if the physical page were closed and reopened one or more times within the extended duration. An extended duration where efficiency gains become significant may be associated with a threshold duration (which may be referred to as an extended duration threshold or tRAS_th) that is between the minimum threshold duration and the maximum threshold duration.

The operations associated with maintaining a physical page in an open state for an extended duration may cause a sensing window of the memory cells 205 to decrease more quickly than the operations associated with maintaining a physical page in the open state for a shorter duration. For example, maintaining the physical page in the open state for an extended duration may cause the sensing window of the memory cells 205 to fall below a sensing window threshold in a reduced quantity of cycles—the sensing window threshold may be correlated with a bit error rate threshold for data communicated by the memory die 200. Frequent opening of physical pages for an extended open page duration may be referred to as continuous open page hammering or open page cycling. Also, memory cells 205 in some portions of the memory die 200 (e.g., a top deck) may be more susceptible to the negative effects of extended open page durations than other memory cells 205. In some examples, to increase an operating life of the memory cells 205 exposed to extended open page durations, the memory cells 205 may be configured to have larger sensing windows. Accordingly, an increased quantity of open page cycles may be achieved before the sensing windows of the memory cells 205 fall below the sensing window threshold.

Stress-induced leakage current may refer to a current drawn by a memory cell 205 while being accessed and may increase over time. When stress-induced leakage current reaches a threshold, a capacitor in a memory cell 205 may begin to act similar to a resistive element and may become more error prone, may be incapable of being driven to a programmable state, or both. In some examples, stress-induced leakage current reaches a threshold after a memory cell 205 is cycled a threshold quantity of times (e.g., 2e9 cycles), where the threshold may be associated with a quantity of cycles at which point the memory cell 205 begins to produce an excessive quantity of bit errors. The reduction in performance caused by extended access durations and stress-induced leakage current may be referred to as wearout.

Memory cells 205 configured with increased sensing windows (e.g., to overcome the negative effects of extended open page durations) may be more susceptible to stress-induced leakage current. Accordingly, if such memory cells 205 are subjected to a high quantity of cycles (which may also be referred to as stress cycling)—e.g., as a result of a physical page being opened and closed a high quantity of times—a functionality of the memory cells 205 may be lost more quickly than memory cells 205 having smaller sensing windows.

The local memory controller 265 may frequently open some physical pages for a shortened duration—e.g., a duration that is less than the extended duration threshold. Such behavior may be referred to as continuous closed page hammering or closed page cycling. In some examples, the local memory controller 265 frequently opens these physical pages in accordance with a behavior of a host system that stores information in the memory die 200—e.g., if the host system frequently performs access operations to access data that is scattered across multiple physical pages. In such cases, if the memory cells 205 in the memory die 200 are configured with larger sensing windows, the memory cells 205 in those physical pages may reach an end of their operating lives at an accelerated pace relative to the other memory cells 205 in the memory die 200 (and relative to if the memory cells 205 had been configured with smaller sensing windows). Accordingly, configuring the memory cells 205 with larger sensing windows to increase a resiliency against the effects of extended open page durations may increase a susceptibility of the memory cells 205 to the effects of stress cycling. Conversely, maintaining the sensing windows of the memory cells 205 at the lower level may increase a resiliency of the memory cells 205 against the effects of stress cycling but increase a susceptibility of the memory cells 205 to the effects of extended open page durations.

To reduce an effect of stress cycling on memory cells configured to be resilient against extended open page durations and to extend an operating life of a memory device, a memory device may be configured with memory cells of different types—e.g., a first type that is resilient against extended open page durations and a second type that is resilient against stress cycling. Accordingly, the memory device may be configured to move data in logical pages associated with frequent stress cycling from a physical page of memory cells configured to be resilient to extended open page durations to a physical page of memory cells configured to be resilient to stress cycling. Similarly, the memory device may be configured to move data in logical pages associated with frequent extended open page durations from a physical page of memory cells configured to be resilient to stress cycling to a physical page of memory cells configured to be resilient to extended open page durations.

In some examples, the memory die 200 includes a first set of the memory cells 205 that are resilient against extended open page durations (e.g., configured with increased sensing windows) and a second set of the memory cells 205 that are resilient against stress cycling. The first set of the memory cells 205 may be in a first deck and the second set of the memory cells 205 may be in a second deck that is below the first deck. In some examples, the first set of the memory cells 205 have the different resiliency properties when a same manufacturing process is used for the first set of the memory cells 205 and the second set of the memory cells 205—e.g., due to manufacturing limitations, a position of the first set of the memory cells 205 in the memory die 200, etc. In other examples, the first set of the memory cells 205 are manufactured differently than the second set of the memory cells 205 to achieve the different resiliency properties.

By using different manufacturing processes to form different sets of memory cells, the respective resiliency of the different sets of memory cells to respective wearout mechanisms may be increased.

The local memory controller 265 may receive commands to access data stored in memory die 200, where each of the commands may be associated with an access duration. The local memory controller 265 may determine whether to access, as part of executing a command (e.g., a write command), a physical page in the first set of the memory cells 205 or a physical page in the second set of the memory cells 205 based on an access duration of the command. In some examples, the local memory controller 265 may access, as part of executing the command, the first set of the memory cells 205 based on determining that the access duration is greater than a threshold duration. Or the local memory controller 265 may access, as part of executing the command, the second set of the memory cells 205 based on determining that the access duration is less than a threshold duration.

By routing access operations having different access durations to memory cells that are better-suited for the corresponding access durations, an operating life of a memory cells (and thus a memory device) may be increased.

Additionally, or alternatively, the local memory controller 265 may identify a logical page, physical page, or both that has been regularly subjected to extended access durations or to frequency cycling (e.g., experienced over one hundred events, a thousand events, etc.) and move the data stored in the physical page to a memory cell configured to be resilient to the identified type of access behavior. For example, the local memory controller 265 may move the data stored in a physical page of the second set of the memory cells 205 to the first set of the memory cells 205 based on detecting that the physical page has been accessed with an extended access duration a threshold quantity of times (e.g., a thousand times).

By identifying logical resource, physical resources, or both that are associated with specific access behaviors and moving data stored at those resources to other resources that are better-suited for the access behavior, an operating life of a memory cells (and thus a memory device) may be increased with reduced overhead (e.g., less data processing, fewer data transfer operations) relative to routing each access operation to a set of memory cells in accordance with a corresponding access duration.

Figure 3:
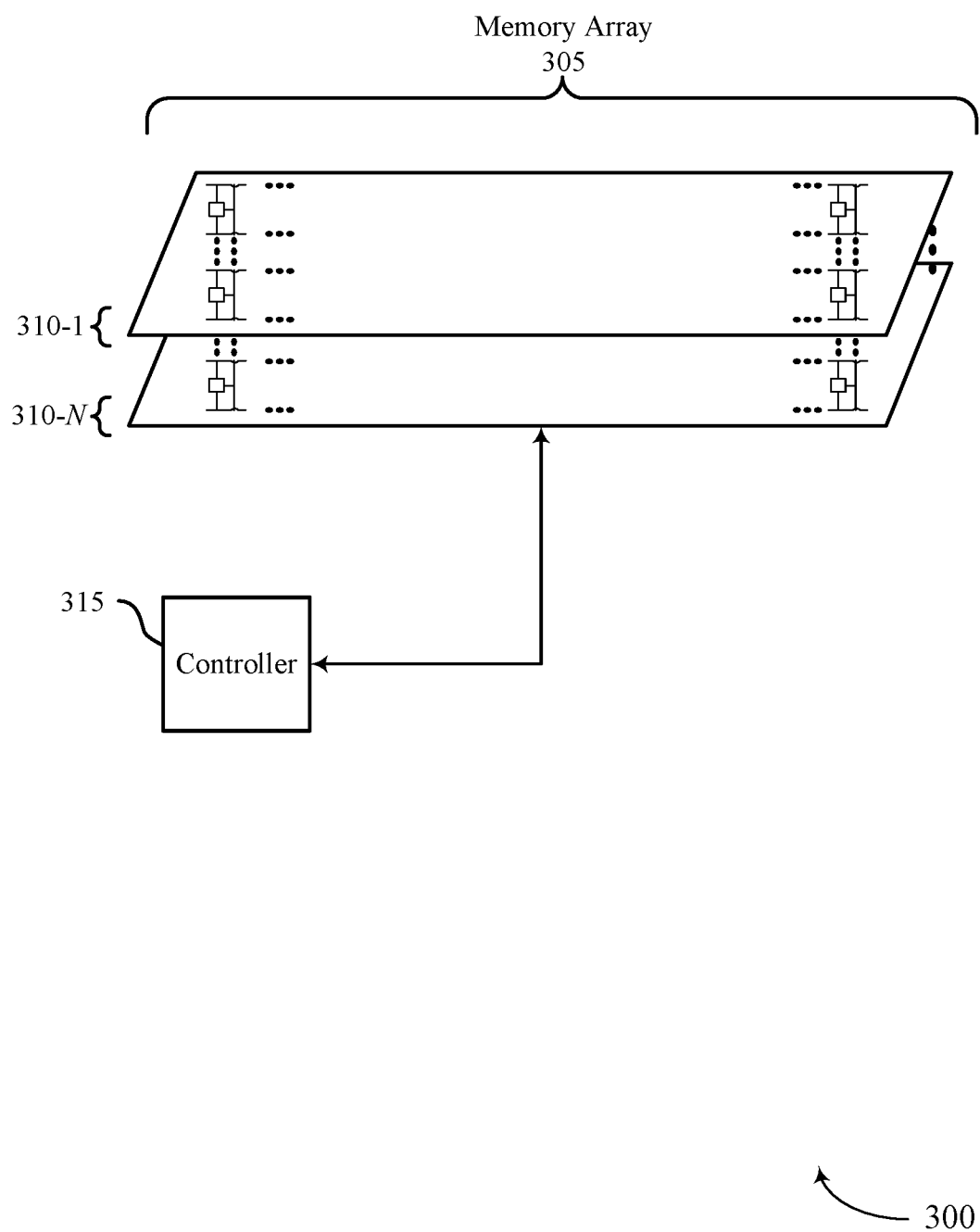
FIG. 3 illustrates an example of a memory device that supports managing memory based on access duration in accordance with examples as disclosed herein.

FIG. 3 illustrates an example of a memory device that supports managing memory based on access duration in accordance with examples as disclosed herein.

Memory device 300 may include controller 315 and memory array 305. Controller 315 may be an example of external memory controller 120, device memory controller 155, or local memory controller 165 of FIG. 1 or local memory controller 265 of FIG. 2. Memory array 305 may include multiple decks 310 of memory cells. In some examples, the decks 310 may be stacked on top of one another. As described herein, the memory array 305 may include memory cells that have different characteristics. For example, first deck 310-1 may include memory cells that are resilient against extended open page access and susceptible to stress cycling. And Nth deck 310-N may include memory cells that are resilient against stress cycling and susceptible to extend open page access. In some examples, N is greater than or equal to 2.

In some examples, the memory cells in first deck 310-1 and Nth deck 310-N are formed using a same manufacturing process, where the memory cells in first deck 310-1 may have different characteristics than the memory cells in Nth deck 310-N as a result of limitations of the manufacturing process, a position of the memory cells, etc. In some examples, the memory cells in first deck 310-1 may have large sensing windows of a first size (and thus may be more resilient to window degradation caused by extended open page access). For example, the memory cells in first deck 310-1 may be capable of being open page-cycled up to 5e7 times if tRAS_max is set to 2 μs or up to 2e8 times if tRAS_max is set to 500 ns. And the memory cells in Nth deck 310-N may have smaller sensing windows of a second size (and thus may be more resilient to stress-induced leakage current caused by stress cycling). For example, the memory cells in Nth deck 310-N may be capable of being closed page-cycled up to 2e9 times.

In other examples, the memory cells in first deck 310-1 may be formed using a first manufacturing process that is configured to form the memory cells in first deck 310-1 with a sensing window that is greater than a threshold. And the memory cells in Nth deck 310-N may be formed using a second manufacturing process that is configured to form the memory cells in Nth deck 310-N with a sensing window that is less than the threshold. Thus, the memory cells in first deck 310-1 may have a larger sensing window than the memory cells in first deck 310-1. In such cases, the resiliency of the memory cells in first deck 310-1 to open page cycling and the memory cells in Nth deck 310-N to closed page cycling may be increased relative to differences in resiliency resulting from a single manufacturing process.

Controller 315 may be configured to route access operations to one of the decks 310 based on respective access durations of the access operations and the characteristics of the memory cells in the different decks 310. In some examples, controller 315 receives a write command from a host system, where the write command may include a logical address and an access duration and may be associated with a set of data to be written to memory array 305. In some examples, if controller 315 has not yet written data to the logical address, controller 315 may write the set of data to a set of memory cells in one of the decks 310 at a corresponding physical address based on the access duration. For example, if the access duration is greater than a threshold duration, controller 315 may write the set of data to a physical address of first deck 310-1. Or, if the access duration is less than or equal to a threshold duration, controller 315 may write the set of data to a physical address of Nth deck 310-N. After writing the set of data to a physical address, controller 315 may update a logical-to-physical address relationship for the logical address to point to the corresponding physical address.

In some examples, if controller 315 has written data to the logical address, controller 315 may write the set of data to the corresponding physical address based on the access duration. For example, if the corresponding physical address is in first deck 310-1 and the access duration is less than a threshold duration, controller 315 may write the set of data to a physical address of Nth deck 310-N. Controller 315 may also update a logical-to-physical address relationship for the logical address to point to the new physical address in Nth deck 310-N. Or if the access duration is greater than a threshold duration, controller 315 may write the set of data to the corresponding physical address in first deck 310-1.

In other examples, if controller 315 has written data to the logical address, controller 315 may write the set of data to the corresponding physical address regardless of the access duration—e.g., if the corresponding physical address has not been identified as being subjected to closed or open page cycling. However, if the corresponding physical address has been identified as being subjected to closed or open page cycling, controller 315 may determine whether to write the set of data to the corresponding physical address (which may be in first deck 310-1 or Nth deck 310-N). For example, if the corresponding physical address is in Nth deck 310-N and identified as being subjected to open page cycling, controller 315 may write the set of data to a new physical address in first deck 310-1. Thus, the controller 315 may transfer data between decks of memory cells based on identifying that the data is being subjected to closed page cycling or open page cycling. In such examples, the controller 315 may identify the type of cycling experienced by the data, identify the type of cycling for which the current address storing the data has resilience, and may transfer the data to a different physical address if there exists a mismatch between the cycling experienced by the data and the resilience of the current physical address. Controller 315 may also update a logical-to-physical address relationship for the logical address to point to the new physical address in first deck 310-1. Conversely, if the corresponding physical address is in first deck 310-1 and identified as being subjected to open page cycling, controller 315 may write the set of data to the corresponding physical address in first deck 310-1.

In some examples, controller 315 receives a read command from a host system, where the read command may include a logical address and an access duration and may be associated with a set of data stored in memory array 305. In some examples, controller 315 may write back the set of data based on the access duration. For example, if the corresponding physical address is in first deck 310-1 and the access duration is less than a threshold duration, controller 315 may write back the set of data to a new physical address of Nth deck 310-N. Controller 315 may also update a logical-to-physical address relationship for the logical address to point to the new physical address in Nth deck 310-N.

In other examples, controller 315 may write back the set of data to the corresponding physical address regardless of the access duration—e.g., if the corresponding physical address has not been identified as being subjected to closed or open page cycling. However, if the corresponding physical address has been identified as being subjected to closed or open page cycling, controller 315 may determine whether to write back the set of data to the corresponding physical address (which may be in first deck 310-1 or Nth deck 310-N). For example, if the corresponding physical address is in Nth deck 310-N and identified as being subjected to open page cycling, controller 315 may write back the set of data to a new physical address in first deck 310-1. Controller 315 may also update a logical-to-physical address relationship for the logical address to point to the new physical address in first deck 310-1. Conversely, if the corresponding physical address is in first deck 310-1 and identified as being subjected to open page cycling, controller 315 may write back the set of data to the corresponding physical address in first deck 310-1.

In some examples, controller 315 determines whether to write or write-back data to one of first deck 310-1 or Nth deck 310-N based on comparing an access duration with multiple thresholds. For example, controller 315 may determine to write or write-back data to first deck 310-1 if the access duration is less than or equal to a first threshold duration. Controller 315 may determine to write or write-back data to Nth deck 310-N if the access duration is greater than a second threshold duration that is greater than the first threshold duration. Controller 315 may determine to write to either one of first deck 310-1 or Nth deck 310-N (e.g., based on some other criteria, randomly) if the access duration is between the first threshold duration and the second threshold duration. Distributed closed page cycling performance may be associated with access operations that are between continuous closed page cycling and continuous open page cycling. In some examples, distributed closed page cycling is associated with access operations having access durations that are between the first threshold duration and the second threshold duration.

By shifting extended page access operation to a first deck that is resilient to extended open page cycling (e.g., first deck 310-1) and the other page access operations to another deck that is resilient to stress cycling (e.g., Nth deck 310-N), the stress cycling of memory cells in the first deck may be reduced—e.g., as longer, but fewer, accesses may be performed for the memory cells in the first deck throughout an operating life of memory device 300. Therefore, the memory cells in the first deck may be configured with large sensing windows and, thus, may be open page-cycled up to an upper open page cycling limit (e.g., 5e7 times for tRAS_max equal to 2 μs or 2e8 times for tRAS_max equal to 500 ns) with reduced concern for errors caused by stress-induced leakage current. Also, the sensing windows of the memory cells in the other deck may be exposed to relatively shorter access durations—e.g., as shorter, but additional, accesses may be performed for the memory cells in the other deck throughout an operating life of memory device 300. Therefore, the memory cells in the other deck may be configured with smaller sensing windows and, thus, may be stress cycled up to an upper closed page cycling limit (e.g., 2e9) with reduced concern for errors caused by sensing window reduction. In some examples, configuring the memory array 305 with the different types of memory cells enables memory device 300 to output data with a same reliability throughout a same operating life based on increasing the cycling limit of the memory cells by a factor of two.

Also, configuring the memory array 305 with the different types of decks may increase distributed closed page cycling performance. In some examples, access operations associated with distributed closed page cycling may be routed to first deck 310-1 at a beginning of an operating life of memory device 300 (e.g., to take advantage of the larger sensing windows) and to Nth deck 310-N once the memory cells in first deck 310-1 reach an open page cycling limit. At the time the access operations are routed to the Nth deck 310-N, a sensing window of the memory cells of in Nth deck 310-N may be increased relative to the beginning of the operating life (e.g., as a result of a "wake up" characteristic of the memory cells).

In some examples, memory array 305 may include more than two decks 310 (e.g., three decks) and may use multiple access duration thresholds (e.g., two access duration thresholds) to determine which memory cells to access, as similarly described herein. For example, memory array 305 may access (e.g., for a write or write-back operation) Nth deck 310-N if an access duration is less than a first access duration threshold, a middle deck 310 if the access duration is greater than the first access duration threshold and smaller than a second access duration threshold, and a first deck 310-1 if the access duration is greater than the second access duration threshold. As similarly described herein, the memory cells on the different decks 310 may be differently suited for different open page durations and stress cycling. For example, memory cells in Nth deck 310-N may be better-suited for stress cycling than the middle deck 310 and first deck 310-1. Memory cells in the middle deck 310 may be better-suited for extended open page durations than Nth deck 310-N and for stress cycling than first deck 310-1. And first deck 310-1 may be better suited for extended open page durations than Nth deck 310-Nor the middle deck.

Figure 4:
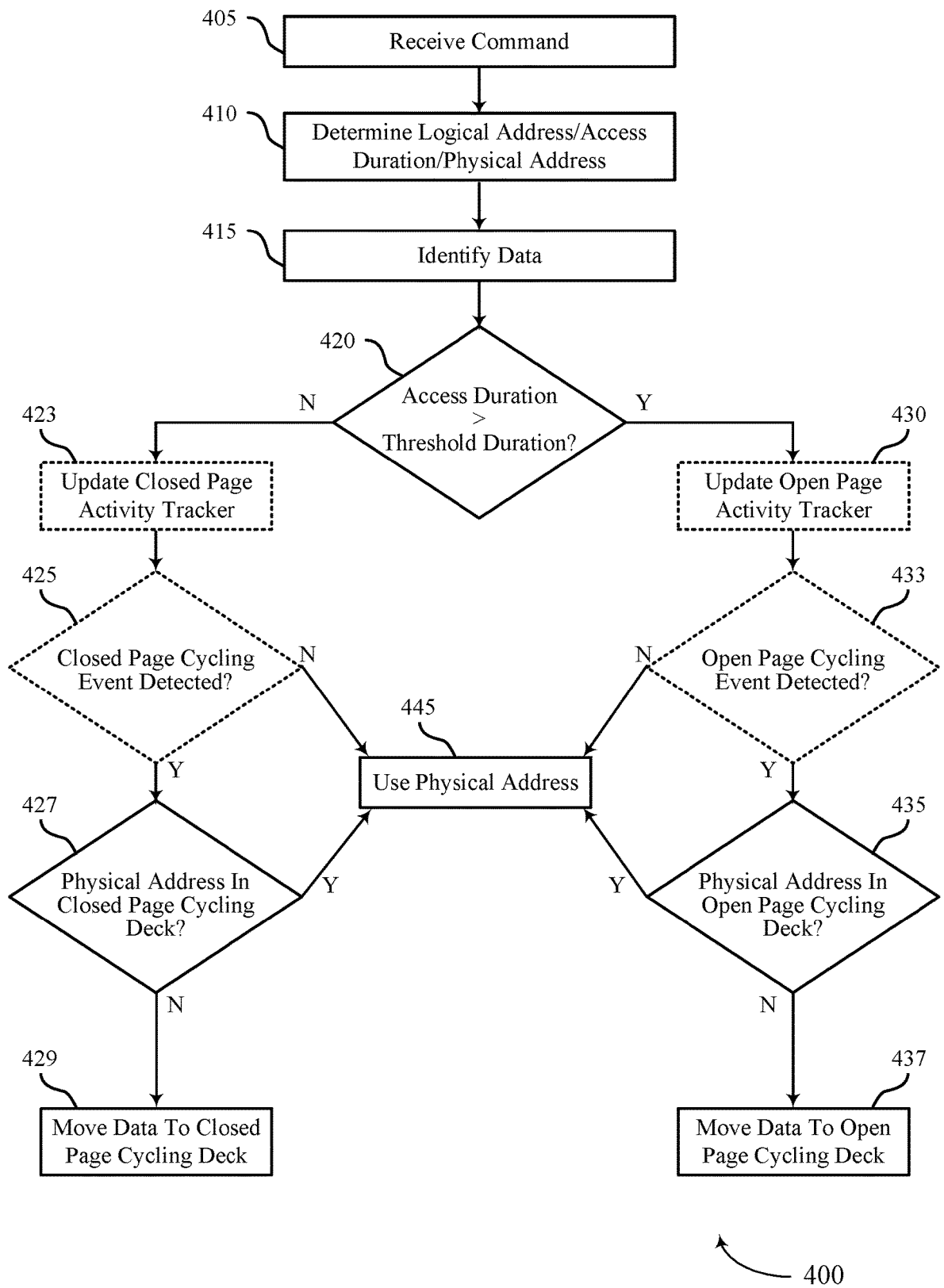
FIG. 4 illustrates an example of a set of operations for managing memory based on access duration in accordance with examples as disclosed herein.

FIG. 4 illustrates an example of a set of operations for managing memory based on access duration in accordance with examples as disclosed herein.

Flowchart 400 may be performed by a controller, which may be an example of an external memory controller, a device memory controller, a local memory controller, or controller described herein. In some examples, flowchart 400 illustrates an example set of operations performed to support managing memory based on access duration. For example, flowchart 400 may include operations for determining whether to access a deck configured to be resilient to open page cycling (e.g., such as first deck 310-1 of FIG. 3) or a deck configured to be resilient to closed page cycling (e.g., such as Nth deck 310-N of FIG. 3).

Aspects of the flowchart 400 may be implemented by a controller, among other components. Additionally, or alternatively, aspects of the flowchart 400 may be implemented as instructions stored in memory (e.g., firmware stored in a memory coupled with a controller). For example, the instructions, when executed by a controller (e.g., a local memory controller of FIGS. 1 through 3), may cause the controller to perform the operations of the flowchart 400.

One or more of the operations described in flowchart 400 may be performed earlier or later, omitted, replaced, supplemented, or combined with another operation. Also, additional operations described herein may replace, supplement or be combined with one or more of the operations described in flowchart 400.

At 405, a command may be received (e.g., by the controller). The command may be a read command or a write command. The command may include a logical address, indicate an access duration, and be associated with a set of data to be stored at or read from the logical address.

At 410, the logical address and access duration associated with the command may be determined (e.g., by the controller). Also, a physical address corresponding to the logical address may be determined (e.g., by the controller). In some examples, the controller determines the physical address based on an existing logical-to-physical address mapping maintained by the controller. The logical-to-physical address mapping may have been generated by the controller during a previous operation used to write data for the logical address to a corresponding physical address.

In some examples, the controller may determine that no physical address corresponds to the logical address (e.g., if the host device is writing data to the logical address for a first time). Accordingly, the controller may determine a physical address to associate with the logical address. In some examples, the controller determines the physical address based on the access duration. For example, the controller may select a physical address in the extended page access deck (the deck resilient to open page cycling) if the access duration is greater than a threshold duration. Or the controller may select a physical address in the extended cycling deck (the deck resilient to closed page cycling) if the access duration is less than or equal to the threshold duration. In other examples, the controller determines the physical address based on a different criterion (e.g., power consumption, data rate, etc.) or at random.

At 415, data associated with the command may be identified (e.g., by the controller). In some examples, the controller receives the identified data from a host device (e.g., if the command is a write command). In some examples, the controller identifies data stored at the corresponding physical address (e.g., if the command is a read command).

At 420, whether the access duration is greater than the threshold duration may be determined. For example, the controller may compare the access duration with a threshold duration. In some examples, the controller compares the access duration with multiple threshold durations.

At 423, a closed page activity tracker may be updated (e.g., by the controller) if the access duration is determined as less than or equal to the threshold duration. The closed page activity tracker may be used to keep track of a quantity of times a logical address, physical address, or both has been accessed for less than or equal to the threshold duration.

At 425, whether a closed page cycling event is detected for the logical address, physical address, or both may be determined (e.g., by the controller). The controller may identify a closed page cycling event for the logical address based on determining that the logical address has been closed page-cycled a threshold quantity of times (e.g., at least a hundred times). The controller may identify a closed page cycling event for the physical address based on determining that the physical address has been closed page-cycled a threshold quantity of times (e.g., at least a hundred times). If the controller does not identify a closed page cycling event (e.g., based on determining that the logical or physical address has not been closed page-cycled the threshold quantity of times), the controller may proceed to performing the operations described at 445 using the identified physical address.

At 427, based on detecting the closed page cycling event, whether the identified physical address is located in the closed page cycling deck may be determined (e.g., by the controller). For example, the controller may compare the physical address with a range of physical addresses corresponding to the physical addresses of the closed page cycling deck. In some examples, controller may compare the physical address with a threshold physical address that separates the physical addresses of the closed page cycling deck from the physical address of the open page cycling deck. In some examples, controller may determine the physical address is located in the closed page cycling deck based on an indicator in the physical address that indicates that it is in the closed page cycling deck. If the controller determines that the physical address is located in the closed page cycling deck, the controller may proceed to performing the operations described at 445 using the identified physical address—e.g., because the memory cells at the physical address may already be resilient to closed page cycling.

At 429, based on determining that the data is located in a different deck than the closed page cycling deck, the data may be moved to the closed page cycling deck (e.g., by the controller). If the received command is a write command, the controller may move the data to the closed page cycling deck by identifying a new physical address in the closed page cycling deck and then writing the data to the new physical address instead of the previously identified physical address in the different deck. If the received command is a read command, the controller may move the data to the closed page cycling deck by reading the data from the previously identified physical address in the different deck and writing the data back to the new physical address. In some examples, the controller may update a logical-to-physical address mapping based on writing or writing back the data to the new physical address to associate the new physical address with the identified logical address.

At 430, an open page activity tracker may be updated (e.g., by the controller) if the access duration is determined as greater than the threshold duration. The open page activity tracker may be used to keep track of a quantity of times a logical address, physical address, or both has been accessed for greater than the threshold duration.

At 433, whether an open page cycling event is detected for the logical address, physical address, or both may be determined (e.g., by the controller). The controller may identify an open page cycling event for the logical address based on determining that the logical address has been open page-cycled a threshold quantity of times (e.g., at least a hundred times). The controller may identify an open page cycling event for the physical address based on determining that the physical address has been open page-cycled a threshold quantity of times (e.g., at least a hundred times). If the controller does not identify an open page cycling event (e.g., based on determining that the logical or physical address has not been open page-cycled the threshold quantity of times), the controller may proceed to performing the operations described at 445 using the identified physical address.

At 435, based on detecting the open page cycling event, whether the identified physical address is located in the open page cycling deck may be determined (e.g., by the controller). For example, the controller may compare the physical address with a range of physical addresses corresponding to the physical addresses of the open page cycling deck. In some examples, controller may compare the physical address with a threshold physical address that separates the physical addresses of the closed page cycling deck from the physical address of the open page cycling deck. In some examples, controller may determine the physical address is located in the open page cycling deck based on an indicator in the physical address that indicates that it is in the open page cycling deck. If the controller determines that the physical address is located in the open page cycling deck, the controller may proceed to performing the operations described at 445 using the identified physical address—e.g., because the memory cells at the physical address may already be resilient to open page cycling.

At 437, based on determining that the data is located in a different deck than the open page cycling deck, the data may be moved to the open page cycling deck (e.g., by the controller). If the received command is a write command, the controller may move the data to the open page cycling deck by identifying a new physical address in the open page cycling deck and then writing the data to the new physical address instead of the previously identified physical address in the different deck. If the received command is a read command, the controller may move the data to the open page cycling deck by reading the data from the previously identified physical address in the different deck and writing the data back to the new physical address. In some examples, the controller may update a logical-to-physical address mapping based on writing or writing back the data to the new physical address to associate the new physical address with the identified logical address.

At 445, the identified physical address may be used to perform the access operations associated with the received command. That is, the controller may write or write back data to the physical address that is identified or determined by the controller when the command is received. In some examples, the controller uses the identified physical address if the identified physical address is already in the deck that is better-suited for the identified access duration—e.g., when the identified physical address is in the open page cycling deck and the access duration is greater than the threshold duration. In some examples, the controller uses the identified physical address if neither a closed page cycling event nor an open page cycling event has been detected for the identified logical address, the identified physical address, or both.

Figure 5:
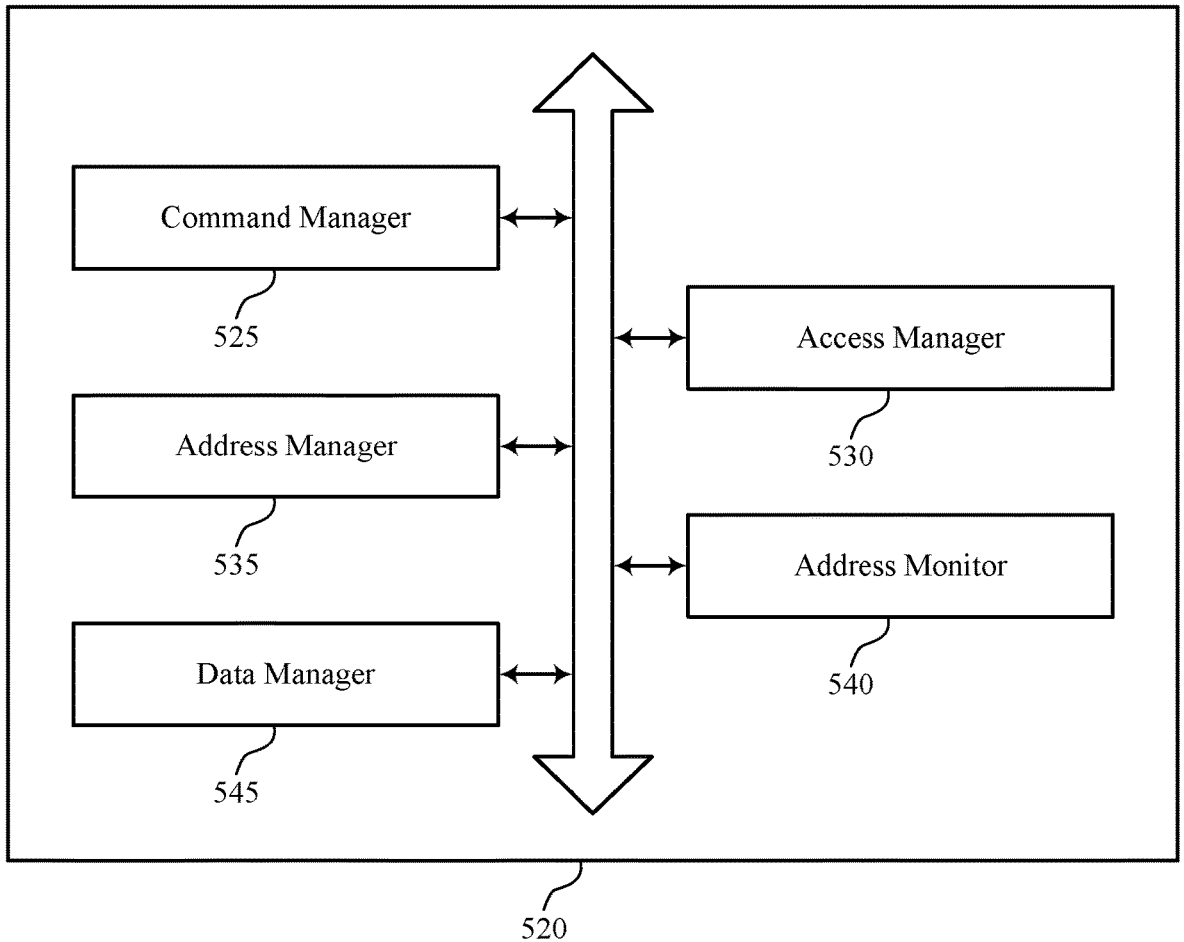
FIG. 5 shows a block diagram of a memory device that supports managing memory based on access duration in accordance with examples as disclosed herein.

FIG. 5 shows a block diagram 500 of a memory device 520 that supports managing memory based on access duration in accordance with examples as disclosed herein. The memory device 520 may be an example of aspects of a memory device as described with reference to FIGS. 1 through 4. The memory device 520, or various components thereof, may be an example of means for performing various aspects of managing memory based on access duration as described herein. For example, the memory device 520 may include a command manager 525, an access manager 530, an address manager 535, an address monitor 540, a data manager 545, or any combination thereof. Each of these components may communicate, directly or indirectly, with one another (e.g., via one or more buses).

The command manager 525 may be configured as or otherwise support a means for receiving a command associated with an access duration. The access manager 530 may be configured as or otherwise support a means for determining whether to access, as part of executing the command, a first set of memory cells of a memory device or a second set of memory cells of the memory device based at least in part on the access duration, a resiliency of the first set of memory cells against being repeatedly opened for a threshold duration or longer being greater than a resiliency of the second set of memory cells against being repeatedly opened for the threshold duration or longer. In some examples, the access manager 530 may be configured as or otherwise support a means for accessing, for the access duration as part of executing the command, the first set of memory cells based at least in part on the access duration being greater than the threshold duration or the second set of memory cells based at least in part on the access duration being less than or equal to the threshold duration.

In some examples, a resiliency of the second set of memory cells against being repeatedly opened for less than the threshold duration is greater than a resiliency of the first set of memory cells against being repeatedly opened for less than the threshold duration.

In some examples, the access manager 530 may be configured as or otherwise support a means for determining that the access duration is greater than the threshold duration. In some examples, the address manager 535 may be configured as or otherwise support a means for associating a logical address associated with the command with a physical address of the first set of memory cells based at least in part on the access duration being greater than the threshold duration, where the first set of memory cells are accessed based at least in part on the associating.

In some examples, the access manager 530 may be configured as or otherwise support a means for determining that the access duration is less than or equal to the threshold duration. In some examples, the address manager 535 may be configured as or otherwise support a means for associating a logical address associated with the command with a physical address of the second set of memory cells based at least in part on the access duration being less than or equal to the threshold duration, where the second set of memory cells are accessed based at least in part on the associating.

In some examples, the command includes a write command, and the access manager 530 may be configured as or otherwise support a means for determining that the access duration is greater than the threshold duration. In some examples, the command includes a write command, and the address manager 535 may be configured as or otherwise support a means for selecting a physical address of the first set of memory cells to store information associated with the write command based at least in part on the access duration being greater than the threshold duration, where accessing the first set of memory cells or the second set of memory cells further includes writing the information at the physical address of the first set of memory cells.

In some examples, the command includes a read command, and the access manager 530 may be configured as or otherwise support a means for determining that the access duration is greater than the threshold duration. In some examples, the command includes a read command, and the address manager 535 may be configured as or otherwise support a means for determining that a first physical address associated with the read command is in the second set of memory cells, where accessing the first set of memory cells or the second set of memory cells further includes reading information at the first physical address of the second set of memory cells; and storing the information at a second physical address of the first set of memory cells based at least in part on the access duration being greater than the threshold duration.

In some examples, first set of memory cells is configured with a first sensing window that is greater than a second sensing window configured for the second set of memory cells and the second set of memory cells is configured with a first stress-induced leakage current that is less than a second stress-induced leakage current of the first set of memory cells.

In some examples, the command includes a write command, and the access manager 530 may be configured as or otherwise support a means for determining that the access duration is less than or equal to the threshold duration. In some examples, the command includes a write command, and the address manager 535 may be configured as or otherwise support a means for selecting a physical address of the second set of memory cells to store information associated with the write command based at least in part on the access duration being less than or equal the threshold duration, where accessing the first set of memory cells or the second set of memory cells further includes writing the information at the physical address of the second set of memory cells.

In some examples, the command includes a read command, and the access manager 530 may be configured as or otherwise support a means for determining that the access duration is less than or equal to the threshold duration. In some examples, the command includes a read command, and the address manager 535 may be configured as or otherwise support a means for determining that a first physical address associated with the read command is in the first set of memory cells, where accessing the first set of memory cells or the second set of memory cells further includes reading information at the first physical address of the first set of memory cells; and storing the information at a second physical address of the second set of memory cells based at least in part on the access duration being less than or equal to the threshold duration.

In some examples, the access manager 530 may be configured as or otherwise support a means for determining that the access duration is greater than the threshold duration. In some examples, the address manager 535 may be configured as or otherwise support a means for determining that the command is associated with a logical address corresponding to a first physical address of the first set of memory cells. In some examples, the access manager 530 may be configured as or otherwise support a means for accessing, as part of executing the command, the first physical address of the first set of memory cells based at least in part on the access duration being greater than the threshold duration and the first set of memory cells being configured to be repeatedly accessed for durations greater than the threshold duration.

In some examples, the access manager 530 may be configured as or otherwise support a means for determining that the access duration is less than or equal to the threshold duration. In some examples, the address manager 535 may be configured as or otherwise support a means for determining that the command is associated with a logical address corresponding to a second physical address of the second set of memory cells. In some examples, the access manager 530 may be configured as or otherwise support a means for accessing, as part of executing the command, the second physical address based at least in part on the access duration being less than or equal to the threshold duration and the second set of memory cells being configured to be repeatedly accessed for durations less than the threshold duration.

In some examples, the address manager 535 may be configured as or otherwise support a means for determining that the command is associated with a logical address corresponding to a second physical address of the second set of memory cells. In some examples, the address monitor 540 may be configured as or otherwise support a means for determining a quantity of times that the second physical address has been accessed for longer than the threshold duration. In some examples, the data manager 545 may be configured as or otherwise support a means for transferring data from the second physical address to a first physical address of the first set of memory cells based at least in part on the quantity of times being greater than or equal to a threshold quantity of times, where the controller is further configured to access the first set of memory cells based at least in part on transferring the data.

In some examples, the address manager 535 may be configured as or otherwise support a means for determining that the command is associated with a logical address corresponding to a first physical address of the first set of memory cells. In some examples, the address monitor 540 may be configured as or otherwise support a means for determining a quantity of times that the first physical address has been accessed for shorter than or equal to the threshold duration. In some examples, the data manager 545 may be configured as or otherwise support a means for transferring data from the first physical address to a second physical address of the second set of memory cells based at least in part on the quantity of times being greater than or equal to a threshold quantity of times, where the second set of memory cells are accessed based at least in part on transferring the data.

In some examples, the access manager 530 may be configured as or otherwise support a means for limiting access operations for physical pages of the first set of memory cells to a first threshold quantity and access operations for physical pages of the second set of memory cells to a second threshold quantity that is greater than the first threshold quantity.

Figure 6:
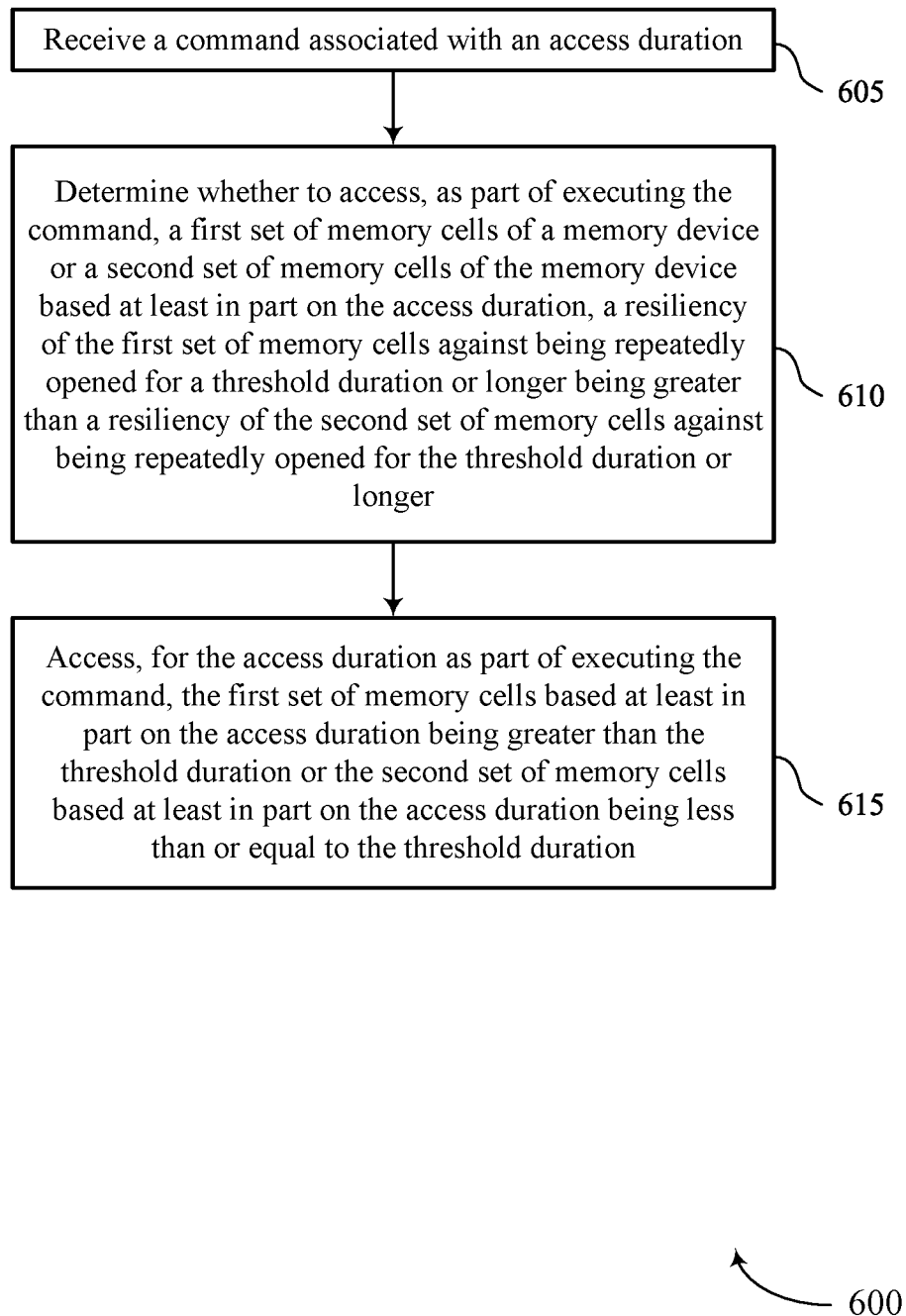
FIG. 6 shows a flowchart illustrating a method or methods that support managing memory based on access duration in accordance with examples as disclosed herein.

FIG. 6 shows a flowchart illustrating a method 600 that supports managing memory based on access duration in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include receiving a command associated with an access duration. The operations of 605 may be performed in accordance with examples as disclosed herein. In some examples, aspects of the operations of 605 may be performed by a command manager 525 as described with reference to FIG. 5.

At 610, the method may include determining whether to access, as part of executing the command, a first set of memory cells of a memory device or a second set of memory cells of the memory device based at least in part on the access duration, a resiliency of the first set of memory cells against being repeatedly opened for a threshold duration or longer being greater than a resiliency of the second set of memory cells against being repeatedly opened for the threshold duration or longer. The operations of 610 may be performed in accordance with examples as disclosed herein. In some examples, aspects of the operations of 610 may be performed by an access manager 530 as described with reference to FIG. 5.

At 615, the method may include accessing, for the access duration as part of executing the command, the first set of memory cells based at least in part on the access duration being greater than the threshold duration or the second set of memory cells based at least in part on the access duration being less than or equal to the threshold duration. The operations of 615 may be performed in accordance with examples as disclosed herein. In some examples, aspects of the operations of 615 may be performed by an access manager 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command associated with an access duration; determining whether to access, as part of executing the command, a first set of memory cells of a memory device or a second set of memory cells of the memory device based at least in part on the access duration, a resiliency of the first set of memory cells against being repeatedly opened for a threshold duration or longer being greater than a resiliency of the second set of memory cells against being repeatedly opened for the threshold duration or longer; and accessing, for the access duration as part of executing the command, the first set of memory cells based at least in part on the access duration being greater than the threshold duration or the second set of memory cells based at least in part on the access duration being less than or equal to the threshold duration.

Aspect 2: The method, apparatus, or non-transitory computer-readable medium of aspect 1 where a resiliency of the second set of memory cells against being repeatedly opened for less than the threshold duration is greater than a resiliency of the first set of memory cells against being repeatedly opened for less than the threshold duration.

Aspect 3: The method, apparatus, or non-transitory computer-readable medium of any of aspects 1 through 2, further including operations, features, circuitry, logic, means, or instructions, or any combination thereof for determining that the access duration is greater than the threshold duration and associating a logical address associated with the command with a physical address of the first set of memory cells based at least in part on the access duration being greater than the threshold duration, where the first set of memory cells are accessed based at least in part on the associating.

Aspect 4: The method, apparatus, or non-transitory computer-readable medium of any of aspects 1 through 3, further including operations, features, circuitry, logic, means, or instructions, or any combination thereof for determining that the access duration is less than or equal to the threshold duration and associating a logical address associated with the command with a physical address of the second set of memory cells based at least in part on the access duration being less than or equal to the threshold duration, where the second set of memory cells are accessed based at least in part on the associating.

Aspect 5: The method, apparatus, or non-transitory computer-readable medium of any of aspects 1 through 4 where the command includes a write command and the method, apparatuses, and non-transitory computer-readable medium, further includes operations, features, circuitry, logic, means, or instructions, or any combination thereof for determining that the access duration is greater than the threshold duration and selecting a physical address of the first set of memory cells to store information associated with the write command based at least in part on the access duration being greater than the threshold duration, where accessing the first set of memory cells or the second set of memory cells further includes writing the information at the physical address of the first set of memory cells.

Aspect 6: The method, apparatus, or non-transitory computer-readable medium of any of aspects 1 through 5 where the command includes a read command and the method, apparatuses, and non-transitory computer-readable medium, further includes operations, features, circuitry, logic, means, or instructions, or any combination thereof for determining that the access duration is greater than the threshold duration and determining that a first physical address associated with the read command is in the second set of memory cells, where accessing the first set of memory cells or the second set of memory cells further includes reading information at the first physical address of the second set of memory cells; and storing the information at a second physical address of the first set of memory cells based at least in part on the access duration being greater than the threshold duration.

Aspect 7: The method, apparatus, or non-transitory computer-readable medium of any of aspects 1 through 6 where first set of memory cells is configured with a first sensing window that is greater than a second sensing window configured for the second set of memory cells and the second set of memory cells is configured with a first stress-induced leakage current that is less than a second stress-induced leakage current of the first set of memory cells.

Aspect 8: The method, apparatus, or non-transitory computer-readable medium of any of aspects 1 through 7 where the command includes a write command and the method, apparatuses, and non-transitory computer-readable medium, further includes operations, features, circuitry, logic, means, or instructions, or any combination thereof for determining that the access duration is less than or equal to the threshold duration and selecting a physical address of the second set of memory cells to store information associated with the write command based at least in part on the access duration being less than or equal the threshold duration, where accessing the first set of memory cells or the second set of memory cells further includes writing the information at the physical address of the second set of memory cells.

Aspect 9: The method, apparatus, or non-transitory computer-readable medium of any of aspects 1 through 8 where the command includes a read command and the method, apparatuses, and non-transitory computer-readable medium, further includes operations, features, circuitry, logic, means, or instructions, or any combination thereof for determining that the access duration is less than or equal to the threshold duration and determining that a first physical address associated with the read command is in the first set of memory cells, where accessing the first set of memory cells or the second set of memory cells further includes reading information at the first physical address of the first set of memory cells; and storing the information at a second physical address of the second set of memory cells based at least in part on the access duration being less than or equal to the threshold duration.

Aspect 10: The method, apparatus, or non-transitory computer-readable medium of any of aspects 1 through 9, further including operations, features, circuitry, logic, means, or instructions, or any combination thereof for determining that the access duration is greater than the threshold duration; determining that the command is associated with a logical address corresponding to a first physical address of the first set of memory cells; and accessing, as part of executing the command, the first physical address of the first set of memory cells based at least in part on the access duration being greater than the threshold duration and the first set of memory cells being configured to be repeatedly accessed for durations greater than the threshold duration.

Aspect 11: The method, apparatus, or non-transitory computer-readable medium of any of aspects 1 through 10, further including operations, features, circuitry, logic, means, or instructions, or any combination thereof for determining that the access duration is less than or equal to the threshold duration; determining that the command is associated with a logical address corresponding to a second physical address of the second set of memory cells; and accessing, as part of executing the command, the second physical address based at least in part on the access duration being less than or equal to the threshold duration and the second set of memory cells being configured to be repeatedly accessed for durations less than the threshold duration.

Aspect 12: The method, apparatus, or non-transitory computer-readable medium of any of aspects 1 through 11, further including operations, features, circuitry, logic, means, or instructions, or any combination thereof for determining that the command is associated with a logical address corresponding to a second physical address of the second set of memory cells; determining a quantity of times that the second physical address has been accessed for longer than the threshold duration; and transferring data from the second physical address to a first physical address of the first set of memory cells based at least in part on the quantity of times being greater than or equal to a threshold quantity of times, where the controller is further configured to access the first set of memory cells based at least in part on transferring the data.

Aspect 13: The method, apparatus, or non-transitory computer-readable medium of any of aspects 1 through 12, further including operations, features, circuitry, logic, means, or instructions, or any combination thereof for determining that the command is associated with a logical address corresponding to a first physical address of the first set of memory cells; determining a quantity of times that the first physical address has been accessed for shorter than or equal to the threshold duration; and transferring data from the first physical address to a second physical address of the second set of memory cells based at least in part on the quantity of times being greater than or equal to a threshold quantity of times, where the second set of memory cells are accessed based at least in part on transferring the data.

Aspect 14: The method, apparatus, or non-transitory computer-readable medium of any of aspects 1 through 13, further including operations, features, circuitry, logic, means, or instructions, or any combination thereof for limiting access operations for physical pages of the first set of memory cells to a first threshold quantity and access operations for physical pages of the second set of memory cells to a second threshold quantity that is greater than the first threshold quantity.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 15: An apparatus, including: a memory device including a first set of memory cells and a second set of memory cells, where the first set of memory cells are configured for a first plurality of access operations of a first duration and the second set of memory cells are configured for a second plurality of access operations of a second duration that is shorter than the first duration; and a controller coupled with the memory device and configured to determine whether to access, in response to a command, the first set of memory cells or the second set of memory cells based at least in part on an access duration associated with the command.

Aspect 16: The apparatus of aspect 15, where the controller is further configured to monitor a quantity of times a physical address is accessed for more than a threshold duration, for less than the threshold duration, or both.

Aspect 17: The apparatus of any of aspects 15 through 16, where the controller is further configured to compare the access duration with a threshold duration.

Aspect 18: The apparatus of any of aspects 15 through 17, where a sensing window of memory cells of the first set of memory cells is greater than a sensing window of memory cells of the second set of memory cells, and a stress-induced leakage current of the memory cells of the second set of memory cells is less than a stress-induced leakage current of the memory cells of the first set of memory cells.

Aspect 19: The apparatus of any of aspects 15 through 18, where a first resiliency of memory cells of the first set of memory cells to being opened for durations that are longer than a threshold duration is greater than a second resiliency of memory cells of the second set of memory cells to being opened for durations that are longer than the threshold duration, and a third resiliency of the memory cells of the second set of memory cells to being opened for durations that are shorter than or equal to the threshold duration is greater than a fourth resiliency of the memory cells of the first set of memory cells to being opened for durations that are shorter than or equal to the threshold duration.

Aspect 20: The apparatus of any of aspects 15 through 19, where the second set of memory cells overlies the first set of memory cells.

Aspect 21: The apparatus of any of aspects 15 through 20, where memory cells of the second set of memory cells have different characteristics than memory cells of the first set of memory cells based at least in part on a process for forming the memory cells of the second set of memory cells above the memory cells of the first set of memory cells.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (or in conductive contact with or connected with or coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory device comprising a first set of memory cells and a second set of memory cells, a resiliency of the first set of memory cells against being repeatedly opened for a threshold duration or longer being greater than a resiliency of the second set of memory cells against being repeatedly opened for the threshold duration or longer; and
   a controller coupled with the memory device and configured to cause the apparatus to:
      receive a command associated with an access duration;
      determine whether to access, as part of executing the command, the first set of memory cells or the second set of memory cells based at least in part on the access duration; and
      access, for the access duration as part of executing the command, the first set of memory cells based at least in part on the access duration being greater than the threshold duration or the second set of memory cells based at least in part on the access duration being less than or equal to the threshold duration.

2. The apparatus of claim 1, wherein a resiliency of the second set of memory cells against being repeatedly opened for less than the threshold duration is greater than a resiliency of the first set of memory cells against being repeatedly opened for less than the threshold duration.

3. The apparatus of claim 1, wherein the controller is further configured to cause the apparatus to:
   determine that the access duration is greater than the threshold duration; and
   associate a logical address associated with the command with a physical address of the first set of memory cells based at least in part on the access duration being greater than the threshold duration, wherein the first set of memory cells are accessed based at least in part on the associating.

4. The apparatus of claim 1, wherein the controller is further configured to cause the apparatus to:
   determine that the access duration is less than or equal to the threshold duration; and
   associate a logical address associated with the command with a physical address of the second set of memory cells based at least in part on the access duration being less than or equal to the threshold duration, wherein the second set of memory cells are accessed based at least in part on the associating.

5. The apparatus of claim 1, wherein the command comprises a write command and the controller is further configured to cause the apparatus to:
   determine that the access duration is greater than the threshold duration; and
   select a physical address of the first set of memory cells to store information associated with the write command based at least in part on the access duration being greater than the threshold duration, wherein the controller configured to access the first set of memory cells or the second set of memory cells is further configured to cause the apparatus to:
      write the information at the physical address of the first set of memory cells.

6. The apparatus of claim 1, wherein the command comprises a read command and the controller is further configured to cause the apparatus to:
   determine that the access duration is greater than the threshold duration; and
   determine that a first physical address associated with the read command is in the second set of memory cells, wherein the controller configured to access the first set of memory cells or the second set of memory cells is further configured to cause the apparatus to:
      read information at the first physical address of the second set of memory cells; and
      store the information at a second physical address of the first set of memory cells based at least in part on the access duration being greater than the threshold duration.

7. The apparatus of claim 1, wherein the first set of memory cells is configured with a first sensing window that is greater than a second sensing window configured for the second set of memory cells and the second set of memory cells is configured with a first stress-induced leakage current that is less than a second stress-induced leakage current of the first set of memory cells.

8. The apparatus of claim 1, wherein the command comprises a write command and the controller is further configured to cause the apparatus to:
   determine that the access duration is less than or equal to the threshold duration; and
   select a physical address of the second set of memory cells to store information associated with the write command based at least in part on the access duration being less than or equal the threshold duration, wherein the controller configured to access the first set of memory cells or the second set of memory cells is further configured to cause the apparatus to:
      write the information at the physical address of the second set of memory cells.

9. The apparatus of claim 1, wherein the command comprises a read command and the controller is further configured to cause the apparatus to:
   determine that the access duration is less than or equal to the threshold duration; and
   determine that a first physical address associated with the read command is in the first set of memory cells, wherein the controller configured to access the first set of memory cells or the second set of memory cells is further configured to cause the apparatus to:
      read information at the first physical address of the first set of memory cells; and
      store the information at a second physical address of the second set of memory cells based at least in part on the access duration being less than or equal to the threshold duration.

10. The apparatus of claim 1, wherein the controller is further configured to cause the apparatus to:
    determine that the access duration is greater than the threshold duration;
    determine that the command is associated with a logical address corresponding to a first physical address of the first set of memory cells; and
    access, as part of executing the command, the first physical address of the first set of memory cells based at least in part on the access duration being greater than the threshold duration and the first set of memory cells being configured to be repeatedly accessed for durations greater than the threshold duration.

11. The apparatus of claim 1, wherein the controller is further configured to cause the apparatus to:
    determine that the access duration is less than or equal to the threshold duration;

determine that the command is associated with a logical address corresponding to a second physical address of the second set of memory cells; and access, as part of executing the command, the second physical address based at least in part on the access duration being less than or equal to the threshold duration and the second set of memory cells being configured to be repeatedly accessed for durations less than the threshold duration.

12. The apparatus of claim 1, wherein the controller is further configured to cause the apparatus to:

determine that the command is associated with a logical address corresponding to a second physical address of the second set of memory cells;

determine a quantity of times that the second physical address has been accessed for longer than the threshold duration; and transfer data from the second physical address to a first physical address of the first set of memory cells based at least in part on the quantity of times being greater than or equal to a threshold quantity of times, wherein the controller is further configured to access the first set of memory cells based at least in part on transferring the data.

13. The apparatus of claim 1, wherein the controller is further configured to cause the apparatus to:

determine that the command is associated with a logical address corresponding to a first physical address of the first set of memory cells;

determine a quantity of times that the first physical address has been accessed for shorter than or equal to the threshold duration; and transfer data from the first physical address to a second physical address of the second set of memory cells based at least in part on the quantity of times being greater than or equal to a threshold quantity of times, wherein the controller is configured to access the second set of memory cells based at least in part on transferring the data.

14. The apparatus of claim 1, wherein the controller is further configured to cause the apparatus to:

limit access operations for physical pages of the first set of memory cells to a first threshold quantity and access operations for physical pages of the second set of memory cells to a second threshold quantity that is greater than the first threshold quantity.

15. The apparatus of claim 1, wherein the first set of memory cells is in a first deck of the memory device and the second set of memory cells is in a second deck of the memory device.

16. An apparatus, comprising:

a memory device comprising a first set of memory cells and a second set of memory cells, wherein the first set of memory cells are configured for a first plurality of access operations of a first duration and the second set of memory cells are configured for a second plurality of access operations of a second duration that is shorter than the first duration; and a controller coupled with the memory device and configured to determine whether to access, in response to a command, the first set of memory cells or the second set of memory cells based at least in part on an access duration associated with the command.

17. The apparatus of claim 16, wherein the controller is further configured to monitor a quantity of times a physical address is accessed for more than a threshold duration, for less than the threshold duration, or both.

18. The apparatus of claim 16, wherein the controller is further configured to compare the access duration with a threshold duration.

19. The apparatus of claim 16, wherein:

a sensing window of memory cells of the first set of memory cells is greater than a sensing window of memory cells of the second set of memory cells, and a stress-induced leakage current of the memory cells of the second set of memory cells is less than a stress-induced leakage current of the memory cells of the first set of memory cells.

20. The apparatus of claim 16, wherein:

a first resiliency of memory cells of the first set of memory cells to being opened for durations that are longer than a threshold duration is greater than a second resiliency of memory cells of the second set of memory cells to being opened for durations that are longer than the threshold duration, and a third resiliency of the memory cells of the second set of memory cells to being opened for durations that are shorter than or equal to the threshold duration is greater than a fourth resiliency of the memory cells of the first set of memory cells to being opened for durations that are shorter than or equal to the threshold duration.

21. The apparatus of claim 16, wherein the second set of memory cells overlies the first set of memory cells.

22. The apparatus of claim 16, wherein memory cells of the second set of memory cells have different characteristics than memory cells of the first set of memory cells based at least in part on a process for forming the memory cells of the second set of memory cells above the memory cells of the first set of memory cells.

23. The apparatus of claim 16, wherein:

the first set of memory cells being configured for the first plurality of access operations of the first duration comprises the first set of memory cells being in a first deck of the memory device, and the second set of memory cells being configured for the second plurality of access operations of the second duration that is shorter than the first duration comprises the second set of memory cells being in a second deck of the memory device.

24. A method, comprising:

receiving a command associated with an access duration;

determining whether to access, as part of executing the command, a first set of memory cells of a memory device or a second set of memory cells of the memory device based at least in part on the access duration, a resiliency of the first set of memory cells against being repeatedly opened for a threshold duration or longer being greater than a resiliency of the second set of memory cells against being repeatedly opened for the threshold duration or longer; and accessing, for the access duration as part of executing the command, the first set of memory cells based at least in part on the access duration being greater than the threshold duration or the second set of memory cells based at least in part on the access duration being less than or equal to the threshold duration.

25. The method of claim 24, further comprising:
determining that the access duration is greater than the threshold duration; and
associating a physical address of the first set of memory cells with a logical address associated with the command based at least in part on the access duration being greater than the threshold duration, wherein the first set of memory cells are accessed based at least in part on the associating.

* * * * *